(12) United States Patent
DeYoung et al.

(10) Patent No.: US 7,141,496 B2
(45) Date of Patent: Nov. 28, 2006

(54) METHOD OF TREATING MICROELECTRONIC SUBSTRATES

(75) Inventors: James P. DeYoung, Durham, NC (US); James B. McClain, Raleigh, NC (US); Stephen M. Gross, Chapel Hill, NC (US); Doug Taylor, Franklinton, NC (US); Mark I. Wagner, Raleigh, NC (US); David Brainard, Natick, MA (US)

(73) Assignee: MiCell Technologies, Inc., Raleigh, NC (US)

( * ) Notice: Subject to any disclaimer, the term of this patent is extended or adjusted under 35 U.S.C. 154(b) by 26 days.

(21) Appl. No.: 10/762,905

(22) Filed: Jan. 22, 2004

(65) Prior Publication Data

US 2005/0161819 A1    Jul. 28, 2005

(51) Int. Cl.
*H01L 21/44* (2006.01)
(52) U.S. Cl. .................. 438/674; 257/E21.54
(58) Field of Classification Search ................ 438/584, 438/597, 674, 685, 686
See application file for complete search history.

(56) References Cited

U.S. PATENT DOCUMENTS 5,789,027 A    8/1998   Watkins et al.
6,491,978 B1 *  12/2002  Kalyanam ............ 427/255.394
6,497,921 B1   12/2002  Carbonell et al.
6,641,678 B1   11/2003  DeYoung et al.
6,653,236 B1 *  11/2003  Wai et al. ................... 438/687
6,953,041 B1 *  10/2005  DeYoung et al. ............ 134/1.1
2003/0198895 A1  10/2003  Toma et al.

FOREIGN PATENT DOCUMENTS

WO    WO 02/066176    8/2002

OTHER PUBLICATIONS

U.S. Appl. No. 10/681,515, filed Oct. 8, 2003 entitled *Method of Coating Microelectronic Substrates*.

* cited by examiner

*Primary Examiner*—Scott B. Geyer
(74) *Attorney, Agent, or Firm*—Myers Bigel Sibley & Sajovec, P.A.

(57) ABSTRACT

A method of treating a dielectric surface portion of a semiconductor substrate, comprising the steps of: (a) providing a semiconductor substrate having a dielectric surface portion; and then (b) treating said dielectric surface portion with a coating reagent, the coating reagent comprising a reactive group coupled to a coordinating group, with the coordinating group having a metal bound thereto, so that the metal is deposited on the dielectric surface portion to produce a surface portion treated with a metal.

19 Claims, No Drawings

METHOD OF TREATING MICROELECTRONIC SUBSTRATES

FIELD OF THE INVENTION

The present invention concerns substrates such as microelectronic substrates and methods of treating surface portions thereof, including etch-damaged surface portions.

BACKGROUND OF THE INVENTION

Decreasing feature sizes and increased aspect ratios on integrated circuits (IC) has led to the investigation of alternative methods of applying thin metal films to patterned surfaces for use as barrier layers, seed layers, gates, etc. Chemical fluid deposition (CFD) is one such technique that uses a supercritial fluid, usually CO2, as the solvent for metal precursors that are typically chemically reduced on a heated substrate in the presence of a dissolved reducing agent. This technique combines the process advantages of liquid and gaseous based metal depostion techniques and has been examined for use in various microelectronic applications. One of the potential problems observed with CFD is that the excellent transport and surface wetting properties of supercritical fluids lead to metal penetration into the dielectric film, especially with porous low k materials. This problem has also been observed to a lesser degree with CVD and ALD, two other methods for metal deposition. Metal penetration into the dielectric film raises the k value and can lead to open circuits, and so it is desired to devise a method that would prevent or reduce metal penetration by driving deposition on the low k surface.

Existing etch methods for low k films often result in damage due to radical attack on, or oxidation of, the dielectric film. Furthermore, post etch steps can include photoresist ashing processes that also attack the dielectric material. For CVD applied organosilicate glass (OSG) or spin on carbon doped oxide (CDO) films, this is usually observed as replacement of Si—O—C groups or Si—O—Si groups with polar Si—OH groups These hydrophilic substituents can lead to moisture absorption and elevated k values. It has been shown that treatment of such etch damaged films with hexamethyldisilazine (HMDS) or organochloro silanes can restore original k values by capping the Si—OH moiety with hydrophobic organic groups. These passivating treatments have been applied from both liquid solvents and supercritical $CO_2$ (see, e.g., Toma and Schilling, U.S. Patent Application No. 20030198895).

SUMMARY OF THE INVENTION

A first aspect of the present invention is a method of treating a dielectric surface portion of a semiconductor substrate, comprising the steps of: (a) providing a semiconductor substrate having a dielectric surface portion; and then (b) treating said dielectric surface portion with a coating reagent comprising a reactive group coupled to a coordinating group, with the coordinating group having a metal bound thereto, such as a coating reagent of the formula $A_m$—$X_n$—$B_o$, wherein:

A is a reactive group,
m is an integer of from 1 to 3,
X is a linking group,
n is an integer of from 0 to 20,
B is a coordinating group having a metal bound thereto; and
o is an integer of from 1 to 3, so that said metal is deposited on said dielectric surface portion to produce a surface portion treated with a metal. In certain embodiments, the reactive group A is hence covalently coupled or bonded to the surface of the dielectric.

In certain embodiments, the treating step is carried out by contacting said surface portion to a solvent carrying said treating reagent.

In certain embodiments, the solvent comprises liquid carbon dioxide. In other embodiments, the solvent comprises supercritical carbon dioxide.

In certain embodiments, the dielectric surface portion comprises an etch-damaged or post-ash surface portion.

In certain embodiments, the dielectric surface portion comprises a porous low k dielectric material.

In certain embodiments, the treating step is carried out by:
(i) treating said dielectric surface portion with a reagent of the formula $A_m$—$X_n$—$B_o$, wherein:
A is a reactive group,
m is an integer of from 1 to 3,
X is a linking group,
n is an integer of from 0 to 20,
B is a coordinating group; and
o is an integer of from 1 to 3; and then
(ii) binding a metal to said coordinating group so that said metal is bound to said dielectric surface portion.

In other embodiments, the treating step may be carried out by:
(i) providing a reagent of the formula $A_m$—$X_n$—$B_o$, wherein:
A is a reactive group,
m is an integer of from 1 to 3,
X is a linking group,
n is an integer of from 0 to 20,
B is a coordinating group having a metal bound thereto; and
o is an integer of from 1 to 3; and then
(ii) treating said dielectric surface portion with said coating reagent so that said metal is bound to said surface portion.

Optionally, but in some embodiments preferably, the method further comprises the step of (iii) depositing an adhesion promoting layer such as tantalum on said treated surface portion to form a metallic layer thereon that promotes adhesion of subsequently applied metal layers. In general, such depositing steps may be carried out by contacting a metal chelate to said surface portion in the presence of a reducing reagent. In certain preferred embodiments, the adhesion promoting metal layer does not penetrate through the surface portion into the semiconductor substrate during the depositing thereof.

Optionally, but in some embodiments preferably, the method further comprises the step of (iv) depositing a metal barrier layer onto said surface portion or said metal adhesion promoting layer to form a barrier against electromigration of copper. In general, such depositing steps may be carried out by contacting a metal chelate to said surface portion in the presence of a reducing reagent. In certain preferred embodiments, when no adhesion promoting step is applied, the barrier layer does not penetrate through the surface portion into the semiconductor substrate during the depositing thereof as the metal film deposition is controlled by the presence of the metal atoms fixed at the surface from the primary treatment steps. Without being bound to any particular theory of the invention, this control is expected as a result of the catalytic behavior of the fixed metal atoms specifically located at the treated surfaces. When a metal adhesion promoting layer is applied prior to barrier layer deposition, no penetration of said barrier metal into said dielectric is seen during barrier layer deposition steps as the adhesion layer acts to seal the surface.

Optionally, but in some embodiments preferably, the method further comprises the step of (v) depositing a metal such as copper on the barrier layer to form a metal seed layer. The seed layer can then be grown upon in accordance with known techniques such as electrochemical deposition of copper to form a full metal layer thereon.

A second aspect of the present invention is a semiconductor substrate, comprising:

(a) a semiconductor substrate having a dielectric surface portion; and (b) a coating formed on said dielectric surface portion, said coating comprising a coating reagent of the formula $A_m$—$X_n$—$B_o$, wherein:

A is a reactive group coupled to said surface portion, m is an integer of from 1 to 3, X is a linking group, n is an integer of from 0 to 20, B is a coordinating group having a metal bound thereto; and o is an integer of from 1 to 3.

The foregoing and other objects and aspects of the invention are explained in greater detail in the specification set forth below.

DETAILED DESCRIPTION OF THE PREFERRED EMBODIMENTS

The present invention is explained in greater detail below. This description is not intended to be a detailed catalog of all the different ways in which the invention may be implemented, or all the features that may be added to the instant invention. For example, features illustrated with respect to one embodiment may be incorporated into other embodiments, and features illustrated with respect to a particular embodiment may be deleted from that embodiment. In addition, numerous variations and additions to the various embodiments suggested herein will be apparent to those skilled in the art in light of the instant disclosure which do not depart from the instant invention. Hence, the following specification is intended to illustrate some particular embodiments of the invention, and not to exhaustively specify all permutations, combinations and variations thereof.

Substrates or devices that may be treated by the present invention include, but are not limited to semiconductor substrates, such as those used to manufacture microelectronic devices such as integrated circuits, microelectromechanical devices (MEMs), optoelectronic devices, and optical devices.

Metals that may be used as the metal in methods of the invention include but are not limited to Pt, Pd, Rh, Ni, Ru, Co, Au, Zr, Mo, Ag, Cr, W, Ta, Hf, V, and Zn. In some embodiments, the metals preferably catalyze a reaction by which subsequent layers are grown or formed on the surface and hence may be referred to as "catalytic metals".

Linking groups that may be used in the present invention include any suitable linking group, including both organic and inorganic (e.g., silicon) linking groups, which may be utilized as monomers or polymers thereof.

Reactive groups that may be used in the present invention include but are not limited to silanes, silanols, halosilanes, acetoxysilanes, enoxysilanes, oximosilanes, alkoxysilanes, aminosilanes, epoxides, and isocyanates.

Carbon dioxide solvents or compositions that may be used in carrying out the present invention typically comprise: (a) carbon dioxide to balance, typically at least 20, 30, 40, 50 or 60 percent; (b) optionally, from 0, 0.01, 0.1, 0.5, 1 or 2 percent to 5 or 10 percent or more of surfactant; (c) optionally, from 0, 0.01, 0.1, 1 or 2 to 30, 40 or 50 percent or more of an organic co-solvent; (d) optionally, from 0, 0.01, or 0.1 to 2 or 5 percent water; and (e) from 0.01, 0.1, or 1 to 2, 5 or 10 percent or more of a coating component distributed in the composition (e.g., as a solution or a dispersion).

Barrier materials that may be used in carrying out the present invention include but are not limited to conductive materials such metals, ceramics, and metal alloys. Specific examples include but are not limited to tantalum, tantalum nitride, titanium nitride, tungsten, tungsten nitride, cobalt, cobalt nitride, cobalt phosphide, cobalt boride, cobalt tungsten phosphide, cobalt tugnsten boride, ruthenium, ruthenium nitride, ruthenium phosphide, and ruthenium boride.

The treating process may be embodied in any convenient format, including but not limited to: Meniscus coating including all variations thereof, including but not limited to those described in U.S. Pat. Nos. 6,497,921 and 6,083,565; spin coating including all variations thereof, including but not limited to those described in U.S. Pat. No. 6,287,640); displacement coating as described herein, including 1) using a second low density supercritical fluid or compressed gas to displace a first supercritical fluid containing a coating or treatment component, or 2) using a gas or supercritical fluid to displace a liquid $CO_2$ composition containing a coating or treatment component 3) using gravity to drain a liquid $CO_2$ composition containing a coating or treatment component 4) using physical movement of the substrate through a liquid, supercritical or dense phase $CO_2$ composition containing a coating or treatment component; and precipitative coating, where a coating component is dissolved or dispersed in dense $CO_2$ under one set of conditions of temperature and pressure (density) and a second set of conditions, typically a reduction in fluid density, is employed causing the coating component to precipitate out of the dense fluid and onto the substrate.

Once the coating or treatment component is deposited onto the substrate, the coating component may become reactively associated with the substrate surface. Typically, this is accomplished spontaneously in carbon dioxide fluid under normal operating conditions or by heating of the substrate to drive the chemical reaction.

Examples of coordinating groups that may be used in carrying out the present invention include, but are not limited to:

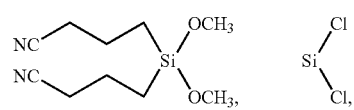

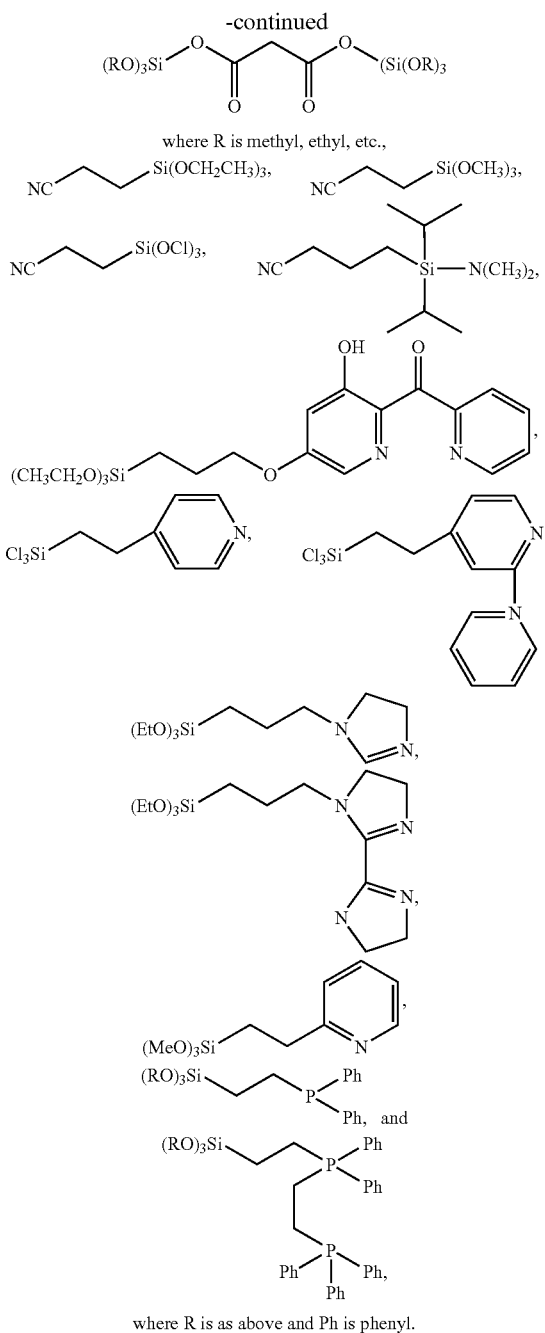

where R is methyl, ethyl, etc.,

Examples of reactive groups that may be utilized in carrying out the present invention include, but are not limited to,

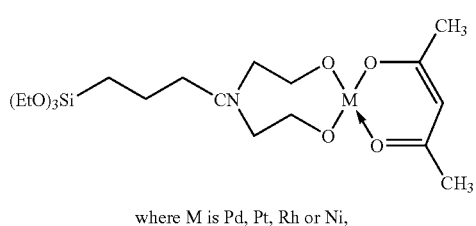

where M is Pd, Pt, Rh or Ni,

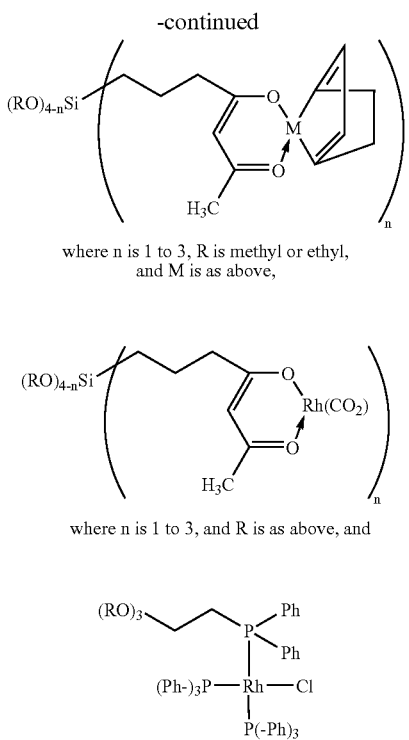

where n is 1 to 3, R is methyl or ethyl, and M is as above, where n is 1 to 3, and R is as above, and where R is as above and Ph is phenyl.

The present invention is explained in greater detail in the following non-limiting Examples.

EXAMPLE 1

Treatment of a Dielectric Material with a Ligand-Containing Binding Agent in $ScCO_2$ A coupon containing a porous low dielectric material composed predominantly of —(Si—O)$_x$— having been patterned through a series of steps including a lithographic patterning step and subsequent plasma etching step is cleaned and dried using standard aqueous techniques and then placed in a pressure vessel as a substrate to be treated. The substrate having had a portion of its surface removed by reactive radicals to form patterns based on defined lithographic steps has an abundance of reactive Si—OH group located predominantly on the substrates now patterned surfaces. Carbon dioxide is added to the pressure vessel to a pressure of 175 bar while the vessel and the substrate are maintained at 60° C. A treatment agent represented by Scheme 1 is added to the vessel to a concentration of 0.5% by weight of carbon dioxide and the vessel is maintained at 60° C. for 10 minutes. The $scCO_2$ solution in then displaced by addition of supercritical helium at 176 bar under near constant pressure and constant flow conditions. Pure $CO_2$ is then fed into the chamber now filled with helium at 176 bar to rinse residual treatment material away from the substrate. The fluid mixture is again flushed with helium at 176 bar after which the helium is vented from the chamber to atmospheric conditions and the substrate was removed from the chamber.

Scheme 1

$A_m$—$X_n$---$B_0$ where 'A' = $(CH_3)_2$—Si—Cl, and

'X' = —(-$CH_2$—$(Ch_2)_3CH_2$)—,

'B' = —$(CH_2C(O)CH_2C(O)CH_3)$, and m, n, and o all = 1.

EXAMPLE 2

Coordination of a Metal to a Dielectric Material Surface Treated in $ScCO_2$

A coupon prepared using the method described in Example 1 is added to a sealed reaction vessel. A vacuum is then applied and the substrate is held at a pressure of 0.1 Torr for 10 minutes. The reaction vessel is then filled with Argon gas to a pressure of 760 torr. A 1.0% by weight solution of Platinum chloric acid $H_2PtCl_6.6H_2O$ in acetone is then added to the reaction vessel which is maintained at room temperature under an argon atmosphere for 10 minutes. The solution is then drained and the substrate is rinse with copious amounts of dry acetone under an argon environment. The reaction vessel in then evacuated and held at a constant pressure of 0.1 Torr for 1 hour. The substrate is then isolated from the reaction vessel and analyzed by surface Secondary Ion Mass Spectroscopy (SIMS) and X-ray Photoelectron Spectroscopy (XPS) which shows significant levels Pt at the surface of the substrate.

EXAMPLE 3

Barrier Layer Deposition from Supercritical $CO_2$

A coupon prepared as in example 2 is added to a cold-walled $CO_2$ vessel such that the substrate can be maintained at an elevated temperature over the fluid temperature. The vessel itself is heated to 70° C. and $CO_2$ is added to 190 bar. An organometallic Ruthenium agent, ruthenocene, is then added to the cell to a concentration of 0.3% by weight of carbon dioxide. The substrate is then heated to 180° C. while the fluid is maintained at a temperature of 70° C. and a pressure of near 190 bar. Using a high-pressure syringe pump, hydrogen gas in then added to the vessel to a mole ration of 20:1 versus the ruthenocene. The substrate is maintained at 180° C. for 10 minutes after which the substrate is cooled to the temperature of the vessel and the fluid is displaced using helium at 195 bar. The substrate is then rinsed with pure $CO_2$ and the fluid is then displaced once more with helium at 195 bar. The helium atmosphere is then vented and the substrate is isolated. Using cross-sectional Scanning Electron Microscopy (SEM) the coupon is determined to obtain a contiguous film approximately 25 nm thick conformably adhered to the surface topography of the coupon containing the porous low dielectric material. Further analysis confirms the film as predominantly Ru(0) metal and confirms that no ruthenium metal has penetrated into the porous low dielectric material.

The foregoing is illustrative of the present invention, and is not to be construed as limiting thereof. The invention is defined by the following claims, with equivalents of the claims to be included therein.

That which is claimed is:

1. A method of treating a dielectric surface portion of a semiconductor substrate, comprising the steps of:
   (a) providing a semiconductor substrate having a dielectric surface portion; and then
   (b) treating said dielectric surface portion with a reagent of the formula $A_m$—$X_n$—$B_o$, wherein:
   A is a reactive group,
   m is an integer of from 1 to 3,
   X is a linking group,
   n is an integer of from 0 to 20,
   B is a coordinating group having a metal bound thereto; and
   o is an integer of from 1 to 3,
   so that said metal is deposited on said dielectric surface portion to produce a surface portion treated with a metal;
   wherein said dielectric surface portion comprises a porous low k dielectric material.

2. The method of claim 1, wherein treating step is carried out by contacting said surface portion to a solvent carrying said reagent.

3. The method of claim 2, wherein said solvent comprises liquid carbon dioxide.

4. The method of claim 2, wherein said solvent comprises supercritical carbon dioxide.

5. The method of claim 1, wherein said dielectric surface portion comprises an etch-exposed surface portion.

6. The method of claim 1, wherein said metal is selected from the group consisting of Pt, Pd, Rh, Ni, Ru, Co, Au, Zr, Mo, Ag, Cr, W, Ta, Hf, V, and Zn.

7. The method of claim 1, wherein said linking group is an organic or silicon linking group.

8. The method of claim 1, wherein said treating step is carried out by:
   (i) providing a reagent of the formula $A_m$—$X_n$—$B_o$, wherein:
   A is a reactive group,
   m is an integer of from 1 to 3,
   X is a linking group,
   n is an integer of from 0 to 20,
   B is a coordinating group having a metal bound thereto; and
   o is an integer of from 1 to 3; and then
   (ii) treating said dielectric surface portion with said coating reagent so that said metal is bound to said surface portion.

9. A method of treating a dielectric surface portion of a semiconductor substrate, comprising the steps of:
   (a) providing a semiconductor substrate having a dielectric surface portion; and then
   (b) treating said dielectric surface portion with a reagent of the formula $A_m$—$X_n$—$B_o$, wherein:
   A is a reactive group,
   m is an integer of from 1 to 3,
   X is a linking group,
   n is an integer of from 0 to 20,
   B is a coordinating group having a metal bound thereto; and
   o is an integer of from 1 to 3,
   so that said metal is deposited on said dielectric surface portion to produce a surface portion treated with a metal;
   wherein said reactive group is selected from the group consisting of silanes, silanols, halosilanes, acetoxysilanes, enoxysilanes, oximosilanes, alkoxysilanes, aminosilanes, epoxides, and isocyanates.

10. A method of treating a dielectric surface portion of a semiconductor substrate, comprising the steps of:
(a) providing a semiconductor substrate having a dielectric surface portion; and then
(b) treating said dielectric surface portion with a reagent of the formula $A_m$—$X_n$—$B_o$, wherein:
A is a reactive group,
m is an integer of from 1 to 3,
X is a linking group,
n is an integer of from 0 to 20,
B is a coordinating group having a metal bound thereto; and
o is an integer of from 1 to 3,
so that said metal is deposited on said dielectric surface portion to produce a surface portion treated with a metal;
wherein said treating step is carried out by:
(i) treating said dielectric surface portion with a reagent of the formula $A_m$—$X_n$—$B_o$, wherein:
A is a reactive group,
m is an integer of from 1 to 3,
X is a linking group,
n is an integer of from 0 to 20,
B is a coordinating group; and
o is an integer of from 1 to 3; and then
(ii) binding a metal to said coordinating group so that said metal is bound to said dielectric surface portion.

11. A method of treating a dielectric surface portion of a semiconductor substrate, comprising the steps of:
(a) providing a semiconductor substrate having a dielectric surface portion; and then
(b) treating said dielectric surface portion with a reagent of the formula $A_m$—$X_n$—$B_o$, wherein:
A is a reactive group,
m is an integer of from 1 to 3,
X is a linking group,
n is an integer of from 0 to 20,
B is a coordinating group having a metal bound thereto; and
o is an integer of from 1 to 3,
so that said metal is deposited on said dielectric surface portion to produce a surface portion treated with a metal; and then
(c) depositing a barrier material on said treated surface portion to form a barrier layer thereon.

12. The method of claim 11, wherein said barrier material comprises a metal, ceramic, or metal alloy.

13. The method of claim 11, wherein said depositing step is carried out exposing said surface portion to a metal chelate in the presence of a reducing reagent.

14. The method of claim 11, wherein said barrier material is selected from the group consisting of tantalum, tantalum nitride, titanium nitride, tungsten, tungsten nitride, cobalt, cobalt nitride, cobalt phosphide, cobalt boride, cobalt tungsten phosphide, cobalt tugnsten boride, ruthenium, ruthenium nitride, ruthenium phosphide, and ruthenium boride.

15. The method of claim 11, wherein said barrier material does not penetrate through said surface portion into said semiconductor substrate during said depositing step.

16. The method of claim 11, further comprising the step of:
(d) depositing a metal on said barrier layer to form a metal seed layer.

17. The method of claim 16, wherein said metal is copper.

18. The method of claim 11, further comprising the step of filling a patterned feature containing said barrier layer with a metal.

19. The method of claim 18, wherein said metal is copper.

* * * * *